United States Patent
Sharma et al.

(10) Patent No.: US 10,355,709 B1
(45) Date of Patent: Jul. 16, 2019

(54) MULTIPLEXED SIGMA-DELTA ANALOG-TO-DIGITAL CONVERTER

(71) Applicant: Analog Devices, Inc., Norwood, MA (US)

(72) Inventors: Yogesh Jayaraman Sharma, Santa Clara, CA (US); Arthur J. Kalb, Santa Clara, CA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 16/111,440

(22) Filed: Aug. 24, 2018

(51) Int. Cl.
  *H03M 3/00* (2006.01)

(52) U.S. Cl.
  CPC ........... *H03M 3/472* (2013.01); *H03M 3/422* (2013.01); *H03M 3/464* (2013.01); *H03M 3/496* (2013.01)

(58) Field of Classification Search
  CPC ........ H03M 1/12; H03M 3/30; H03M 7/3005; H04L 51/14; H04L 45/18; H04L 45/306; H04L 67/2871
  USPC .................................. 341/143, 155, 141, 76
  See application file for complete search history.

(56) References Cited

U.S. PATENT DOCUMENTS

| | | | | |
|---|---|---|---|---|
| 4,514,760 A * | 4/1985 | Balaban | ............... | H04N 9/64 348/480 |
| 5,150,120 A | 9/1992 | Yunus | | |
| 5,235,558 A * | 8/1993 | Woodsum | ............... | G01S 15/00 367/104 |
| 5,248,971 A * | 9/1993 | Mandl | ............... | H03M 3/474 341/141 |
| 5,327,133 A | 7/1994 | Greene | | |
| 5,345,233 A * | 9/1994 | Nagata | ............... | H03M 7/3015 341/76 |
| 5,345,236 A * | 9/1994 | Sramek, Jr. | ............... | H03M 3/474 341/143 |
| 5,345,238 A * | 9/1994 | Eldridge | ............... | H01Q 1/288 342/10 |
| 5,561,425 A | 10/1996 | Therssen | | |
| 5,627,536 A * | 5/1997 | Ramirez | ............... | H03M 3/474 341/141 |

(Continued)

OTHER PUBLICATIONS

"U.S. Appl. No. 15/334,011, Examiner Interview Summary dated Apr. 16, 2018", 3 pgs.

(Continued)

*Primary Examiner* — Jean B Jeanglaude
(74) *Attorney, Agent, or Firm* — Schwegman Lundberg & Woessner, P.A.

(57) ABSTRACT

A sigma-delta ADC circuit with an analog loop filter circuit can be multiplexed between different inputs by flushing the memory of the analog loop filter integrators and the digital decimation filter and filling it with new data for the current input. However, filling the memory can be slow with respect to the sampling frequency because the information about past history has to be built up before meaningful output data can be generated. Thus, the multiplexing rate between channels using a sigma-delta ADC circuit can be slowed by such memory flushing. A multiplexed sigma-delta ADC circuit is described that can overcome these problems so as to be able to support cycle-by-cycle sampling of multiple channels. These techniques can provide a fast sigma-delta analog-to-digital converter (ADC) circuit that is small in area and that can multiplex over a number of channels dynamically.

20 Claims, 4 Drawing Sheets

(56) References Cited

U.S. PATENT DOCUMENTS

| | | | |
|---|---|---|---|
| 5,635,864 A * | 6/1997 | Jones | H03K 5/24 |
| | | | 327/63 |
| 6,271,782 B1 | 8/2001 | Steensgaard-Madsen | |
| 7,095,345 B2 | 8/2006 | Nguyen et al. | |
| 7,385,443 B1 | 6/2008 | Denison | |
| 7,423,567 B2 | 9/2008 | Melanson | |
| 8,094,051 B2 | 1/2012 | Bos | |
| 8,265,769 B2 | 9/2012 | Denison | |
| 8,368,576 B2 * | 2/2013 | Bardsley | H03M 1/12 |
| | | | 341/144 |
| 9,258,004 B2 * | 2/2016 | Kappes | H03M 1/005 |
| 9,391,628 B1 | 7/2016 | Lyden et al. | |
| 9,419,642 B1 | 8/2016 | Nguyen | |
| 9,588,497 B1 | 3/2017 | Monk et al. | |
| 10,135,459 B2 | 11/2018 | Sharma et al. | |
| 2007/0126615 A1 | 6/2007 | Kim et al. | |
| 2009/0085784 A1 * | 4/2009 | Di Giandomenico | |
| | | | H03M 1/1033 |
| | | | 341/141 |
| 2009/0085785 A1 | 4/2009 | Gerfers et al. | |
| 2010/0066577 A1 | 3/2010 | Huang | |
| 2010/0075624 A1 | 3/2010 | Shanan | |
| 2012/0038500 A1 | 2/2012 | Dijkmans et al. | |
| 2012/0139764 A1 * | 6/2012 | Sosio | H03M 3/344 |
| | | | 341/110 |
| 2012/0154193 A1 | 6/2012 | Chang et al. | |
| 2012/0281786 A1 | 11/2012 | Lindemann et al. | |
| 2014/0112372 A1 | 4/2014 | Hoene et al. | |
| 2014/0218223 A1 | 8/2014 | Darshan et al. | |
| 2014/0340249 A1 * | 11/2014 | Bernardinis | H03M 3/47 |
| | | | 341/143 |
| 2015/0145571 A1 | 5/2015 | Perrott | |
| 2015/0188558 A1 * | 7/2015 | Kappes | H03M 1/005 |
| | | | 341/120 |
| 2015/0256194 A1 | 9/2015 | Saito | |
| 2018/0115320 A1 | 4/2018 | Sharma et al. | |
| 2018/0132750 A1 | 5/2018 | Kalb et al. | |
| 2018/0138920 A1 | 5/2018 | Sharma et al. | |

OTHER PUBLICATIONS

"U.S. Appl. No. 15/334,011, Examiner Interview Summary dated Aug. 8, 2017", 3 pgs.

"U.S. Appl. No. 15/334,011, Non Final Office Action dated Feb. 10, 2017", 6 pgs.

"U.S. Appl. No. 15/334,011, Non Final Office Action dated Feb. 21, 2018", 4 pgs.

"U.S. Appl. No. 15/334,011, Notice of Allowance dated Jul. 12, 2018", 7 pgs.

"U.S. Appl. No. 15/334,011, Notice of Allowance dated Oct. 17, 2017", 8 pgs.

"U.S. Appl. No. 15/334,011, Preliminary Amendment filed, Jan. 11, 2018", 8 pgs.

"U.S. Appl. No. 15/334,011, Response filed Aug. 9, 2017 to Non Final Office Action dated Feb. 10, 2017", 11 pgs.

"U.S. Appl. No. 15/334,011, Response filed May 21, 2018 to Non Final Office Action dated Feb. 21, 2018", 9 pgs.

"U.S. Appl. No. 15/621,621, Preliminary Amendment filed Nov. 3, 2017", 6 pgs.

"Optimum Selection of Capacitive Array for Multibit Sigma-Delta Modulators without DEM", (Jan. 1, 2009), 4 pgs.

Bohorquez, Jose L., et al., "A Digitally-Assisted Sensor Interface for Biomedical Applications", 2010 Symposium on VLS! Circuits / Technical Digest of Technical Papers, (2010), 217-218.

Bryant, Michael D., et al., "A Mixed Signal (Analog-Digital) Integrator Design", IEEE Transactions on Circuits and Systems-1: Regular Papers, 59)7), (Jul. 2012), 14-9.

Denison, Tim, et al., "A 2uW 100 n V/rtHz Chopper-Stabilized Instrumentation Amplifier for Chronic Measurement of Neutral Field Potentials", IEEE Journal of Solid-State Circuits, vol. 42, No. 12, (Dec. 2007), 2934-2945.

Muller, Rikky, et al., "A 0.13 mm2, 5uW, DC- Coupled Neutral Signal Acquisition IC With 0.5 V Supply", IEEE Journal of Solid-State Circuits, vol. 47, No. 1, (Jan. 2012), 232-243.

U.S. Appl. No. 15/334,011, filed Oct. 25, 2016, ADC With Capacitive Difference Circuit and Digital Sigma-Delta Feedback.

\* cited by examiner

MULTIPLEXED SIGMA-DELTA ANALOG-TO-DIGITAL CONVERTER

FIELD OF THE DISCLOSURE

This document pertains generally, but not by way of limitation, to integrated circuits, and more particularly, to analog-to-digital converter circuits and systems.

BACKGROUND

In many electronics applications, an analog front end (AFE) can translate analog electrical signals representing real-world phenomenon, e.g. light, sound, temperature, or pressure, to a digital output signal to be used for digital processing, e.g. for further signal processing. For instance, in some precision measurement systems, electronics can be provided with one or more sensors to make measurements and generate analog signals. The analog signals can be provided to an analog-to-digital converter (ADC) to generate a digital representation for further processing.

AFEs can be found in many places such as broadband communication systems, audio systems, receiver systems, etc. AFEs can be used in a broad range of applications including communications, energy, healthcare, instrumentation and measurement, motor and power control, industrial automation and aerospace/defense.

SUMMARY OF THE DISCLOSURE

A sigma-delta ADC circuit with an analog loop filter circuit can be multiplexed between different inputs by flushing the memory of the analog loop filter integrators and the digital decimation filter and filling it with new data for the current input. However, filling the memory can be slow with respect to the sampling frequency because the information about past history has to be built up before meaningful output data can be generated. Thus, the multiplexing rate between channels using a sigma-delta ADC circuit can be slowed by such memory flushing. Retaining past data in the loop filter circuits and skipping samples is not possible as the loop filters are analog circuits and they are not capable of storing past history due to leakage effects. Similarly, skipping samples in the digital decimation filter circuit can alter the filtering action of the decimation filter.

This disclosure describes a multiplexed sigma-delta ADC circuit that can overcome these problems so as to be able to support cycle-by-cycle sampling of multiple channels. The techniques of this disclosure can provide a fast sigma-delta analog-to-digital converter (ADC) circuit that is small in area and that can multiplex over a number of channels dynamically.

In some aspects, this disclosure is directed to a multiplexed multiple channel sigma-delta (SD) analog-to-digital converter (ADC) circuit comprising: a shared analog circuit configured to receive a selected one of a plurality of analog input signals, the shared analog circuit including: an ADC circuit coupled to an input of the analog circuit; and a digital-to-analog converter (DAC) circuit configured to provide an analog feedback signal to the input of the analog circuit; and a plurality of digital channels coupled to an output of the shared analog circuit and the DAC circuit, each of the plurality digital channels configured to generate a digital output signal representing a corresponding one of the analog input signals.

In some aspects, this disclosure is directed to a method of multiplexing multiple channels using a sigma-delta (SD) analog-to-digital converter (ADC) circuit, the method comprising: performing, using a shared analog circuit, an analog-to-digital conversion of a first input signal selected from a plurality of received analog input signals; processing a digital output of the shared analog circuit using a first digital channel selected from a plurality of digital channels; performing a digital-to-analog conversion on the processed digital output to generate a feedback signal to apply to an input of the shared analog circuit; and generating a digital output signal representing a corresponding one of the analog input signals.

In some aspects, this disclosure is directed to a multiplexed multiple channel sigma-delta (SD) analog-to-digital converter (ADC) circuit comprising: means for performing, using a shared analog circuit, an analog-to-digital conversion of a first input signal selected from a plurality of received analog input signals; means for processing the digital output of the shared analog circuit using a first digital channel selected from a plurality of digital channels; means for performing a digital-to-analog conversion on the processed digital output to generate a feedback signal to apply to an input of the shared analog circuit; and means for generating a digital output signal representing a corresponding one of the analog input signals.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

In a successive approximation register (SAR) analog-to-digital converter (ADC) circuit, each digital output code is a function of the last input sample and is independent of the previous input samples processed by the ADC circuit. In other words, the SAR ADC is memoryless. As such, a SAR ADC lends itself to be used for multi-channel solutions. As a result of the memoryless nature of a SAR ADC, it can allow multiplexing between different input signals on a sample-by-sample basis. For a SAR ADC, the delay in clock cycles between two samples of the same channel is equal to the number of channels.

Unlike a SAR ADC, a sigma-delta ADC circuit has memory. In particular, a sigma-delta ADC circuit can include an analog loop filter circuit having multiple analog integrator circuit stages where information from past inputs can be used in conjunction with the current input to process and provide the digital output code. In addition, a sigma-delta ADC circuit can include a digital decimation filter circuit that also has a memory of past input signal values.

A sigma-delta ADC circuit with an analog loop filter circuit can be multiplexed between different inputs by flushing the memory of the analog loop filter integrators and the digital decimation filter and filling it with new data for the current input. However, filling the memory can be slow with respect to the sampling frequency because the information about past history has to be built up before meaningful output data can be generated. Thus, the multiplexing rate between channels using a sigma-delta ADC circuit can be slowed by such memory flushing. Retaining past data in the loop filter circuits and skipping samples is not possible as the loop filters are analog circuits and they are not capable of storing past history due to leakage effects. Similarly, skipping samples in the digital decimation filter circuit can alter the filtering action of the decimation filter.

This disclosure describes a multiplexed sigma-delta ADC circuit that can overcome these problems so as to be able to support cycle-by-cycle sampling of multiple channels. The techniques of this disclosure can provide a fast sigma-delta analog-to-digital converter (ADC) circuit that is small in area and that can multiplex over a number of channels dynamically.

Figure 1:
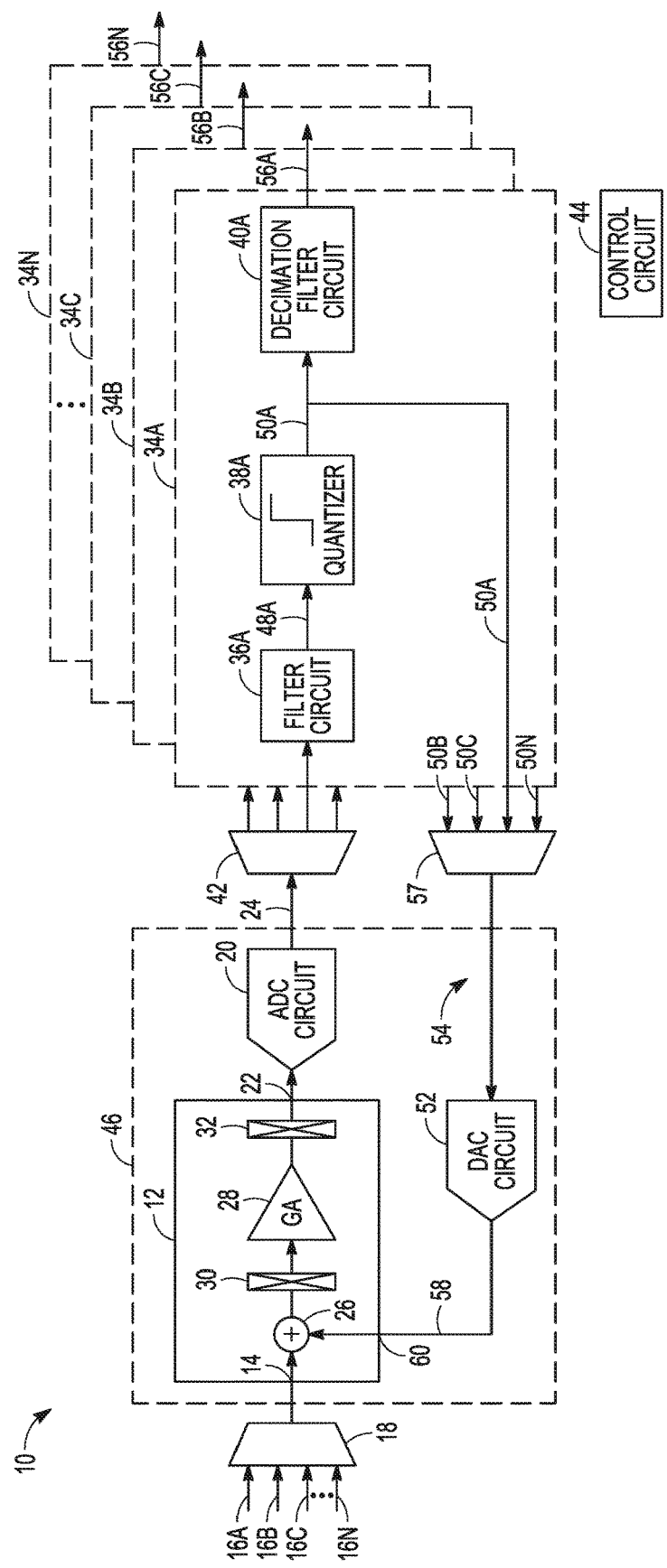
FIG. 1 is a block diagram of an example of a multiplexed, multiple channel sigma-delta analog-to-digital converter circuit in accordance with this disclosure.

FIG. 1 is a block diagram of an example of a multiplexed, multiple channel sigma-delta analog-to-digital converter (ADC) circuit in accordance with this disclosure. The system 10 can include a gain circuit 12 having a first input 14 to receive one of a plurality of analog input signals 16A-16N via an analog input multiplexer circuit 18, and a memoryless ADC circuit 20 to receive an output 22 of the gain circuit 12. Examples of memoryless ADC circuit 20 can include, but are not limited to, a SAR ADC circuit, a pipelined ADC circuit, and a flash ADC circuit.

The ADC circuit 20 can generate a digital output signal 24 corresponding to one of the analog input signals 16A-16N, e.g., an electrocardiogram (ECG) output signal or other signal of interest. In the example configuration shown, the gain circuit 12 can include an adder circuit 26 and a gain amplifier circuit 28, e.g., a capacitive gain amplifier (CGA). In some example implementations, the circuit 10 can further include chop switch circuits 30, 32 to chop the signal being amplified by the gain amplifier circuit 28.

In accordance with this disclosure, the sigma-delta ADC circuit 10 can include a plurality of digital channels 34A-34N, e.g., connected in parallel. Each of the digital channels 34A-34N can include a digital loop filter circuit 36A (also referred to in this disclosure as a "digital filter circuit"), a quantizer circuit 38A, and a decimation filter circuit 40A, e.g., a combination of a digital lowpass filter circuit and a downsampling circuit. The digital output signal 24 corresponding to a particular one of the analog input signals 16A-16N can be coupled to one of the digital channels 34A-34N via a digital demultiplexer circuit 42. Further, to process the received analog input signals 16A-16N, a control circuit 44 can control operation of the input multiplexer circuit 18 to select a particular one of the analog input signals 16A-16N, e.g., signal 16A, and control operation of the digital demultiplexer circuit 42 to select a particular one of the digital channels 34A-34N, e.g., digital channel 34A.

Using the techniques of this disclosure, an analog circuit 46 that can include various analog blocks such as the gain circuit 12, the ADC circuit 20, and the DAC circuit 52 can be shared by the digital channels 34A-34N. Again, each digital channel can include its own digital filter circuit, quantizer circuit, and decimation filter circuit. As such, for an N-channel input, the circuit of FIG. 1 has one set of analog blocks (e.g., gain circuit 12, the ADC circuit 20, and the DAC circuit 52) that can be shared by 'N' sets of digital channels.

As seen in FIG. 1, the digital filter circuit 36A, e.g., of digital channel 34A, can receive the digital output signal 24 of the ADC circuit 20 and provide a filtered digital output 48A to the quantizer circuit 38A. In some example implementations, the digital filter circuit can include one or both of a number of integrator circuits and a low-pass filter circuit. The digital filter circuit can have high gain in a band of interest, for example. In some examples, the quantizer circuit can be a coarse 1-bit quantizer, e.g., a comparator circuit, or in other examples, the quantizer circuit can have more than two levels.

The quantizer circuit 38A can output a quantized digital signal 50A and provide the signal 50A to (1) a digital-to-analog converter (DAC) circuit 52 in a feedback loop 54 and to (2) the digital decimation filter circuit 40A to produce a digital output signal 56A corresponding to a particular one of the received analog input signals 16A-16N. It should be understood that each of the remaining digital channels 34B-34N produce a corresponding digital output signal 56B-56N, which is shown more clearly in FIG. 4.

Each the plurality of digital channels 34A-34N can be coupled to a corresponding input of a digital multiplexer circuit 57. The control circuit 44 can control operation of the multiplexer circuit 57 so as to couple a digital signal of a particular digital channel, e.g., the output signal 50A of the quantizer circuit 38A, via the multiplexer 57 to the input of the DAC circuit 52.

The DAC circuit 52 can generate an analog feedback signal 58 and provide the feedback signal 58 to the second input 60 of the gain circuit 12 such that the digital signal corresponding to a particular digital channel, for example the output 50A of channel 34A, is subtracted from the corresponding input signal 16A by the adder circuit 26. In some example configurations, the DAC circuit 52 can be a capacitive DAC circuit, which can help facilitate integration in configurations that include a capacitive gain amplifier 28. The adder circuit 26 can subtract the analog feedback signal 58 from the original analog input signal, e.g., input signal 16A, to generate a difference signal. It should be noted that the adder circuit 26 is depicted separately for conceptual purposes but in some configurations can form part of the gain circuit 12 itself. For example, the adder circuit 26 can be implemented as a high impedance "summing junction" node onto which charge is injected from multiple inputs, or as inverting and non-inverting inputs of a buffer amplifier, or the like.

The action of the feedback loop 54 can cause the input signal, e.g., input signal 16A, to be reproduced at the output at frequencies where the gain is high. The quantization noise can be shaped by the gain of the feedback loop 54. The decimation filter circuit, e.g., decimation filter circuit 40A, can filter the shaped quantization noise to achieve a high signal-to-noise ratio (SNR) in the band of interest.

For purposes of a non-limiting illustrative explanation, the control circuit 44 can control operation of the input multiplexer circuit 18 to select a first analog input signal 16A to be processed by circuit 10. The difference between the input signal 16A and the feedback signal 58 can be received and amplified by the gain circuit 12. In some example configurations, the control circuit 44 can control chop switch circuits 30, 32 to chop the gain circuit 12 such as to move its 1/f noise out of the band of interest. The amplified difference signal can be digitized by the ADC circuit 20.

The control circuit 44 can control the analog multiplexer 18 to mux the input signal 16A-16N to the analog circuit 46. At the same time, the control circuit 44 can control the digital demultiplexer circuit 42 to couple a corresponding of one of the digital channels 34A-34N to process the corresponding output digital signal from the shared analog circuit 46. For example, the control circuit 44 can select the input signal 16A to be muxed by the analog multiplexer 18 into the analog circuit 46 and the corresponding digital channel 34A, and its associated digital filter circuit 36A and quantizer circuit 38A can process the output digital signal 24. The control circuit 44 can further control multiplexer circuit 57 to select the digital channel 34A corresponding to the input signal 16A and the corresponding output 50A of its digital sigma-delta feedback loop can drive the DAC circuit 52 to the adder circuit 26 whose other input 14 is the input signal 16A form the analog multiplexer 18. The decimation filter circuit 40A of the digital channel 34A can receive an output of the quantizer circuit 38A and can produce a digital output signal 56A corresponding to the received analog input signal 16A.

In a non-limiting illustrative configuration, a fixed capacitive gain amplifier (CGA) circuit 28, e.g., having a gain of 16, can be used to amplify the difference between a selected one of the analog input signals 16A-16N and the feedback signal 58 generated by the DAC circuit 52. The difference signal can be processed by a 14-bit SAR ADC circuit 20. The output digital signal of the SAR ADC circuit 20 can be processed by a selected one of the digital channels 34A-34N, e.g., digital channel 34A, having a digital sigma-delta feedback loop including one or more digital integrator circuits and a quantizer circuit, e.g., quantizer circuit 38A. The output of the digital sigma-delta feedback loop can drive the DAC circuit 52, e.g., a 7-bit DAC circuit. In some example implementations, the DAC circuit 52 can include a noise-shaping DAC circuit.

One way of implementing the digital is for each channel to have its own digital block. Alternatively, it may be more area efficient to include one shared digital computation engine with separate memories for each channel.

It should be noted that the analog blocks can operate at an 'N' times higher sampling frequency. However, there can be substantial area savings as one set of analog blocks is used. Further, the architecture described in this disclosure can scale particularly well in going to finer geometry processes as the 'N' digital blocks (e.g., digital filter circuit, quantizer circuit, and decimation filter circuit) can scale dramatically.

Figure 2:
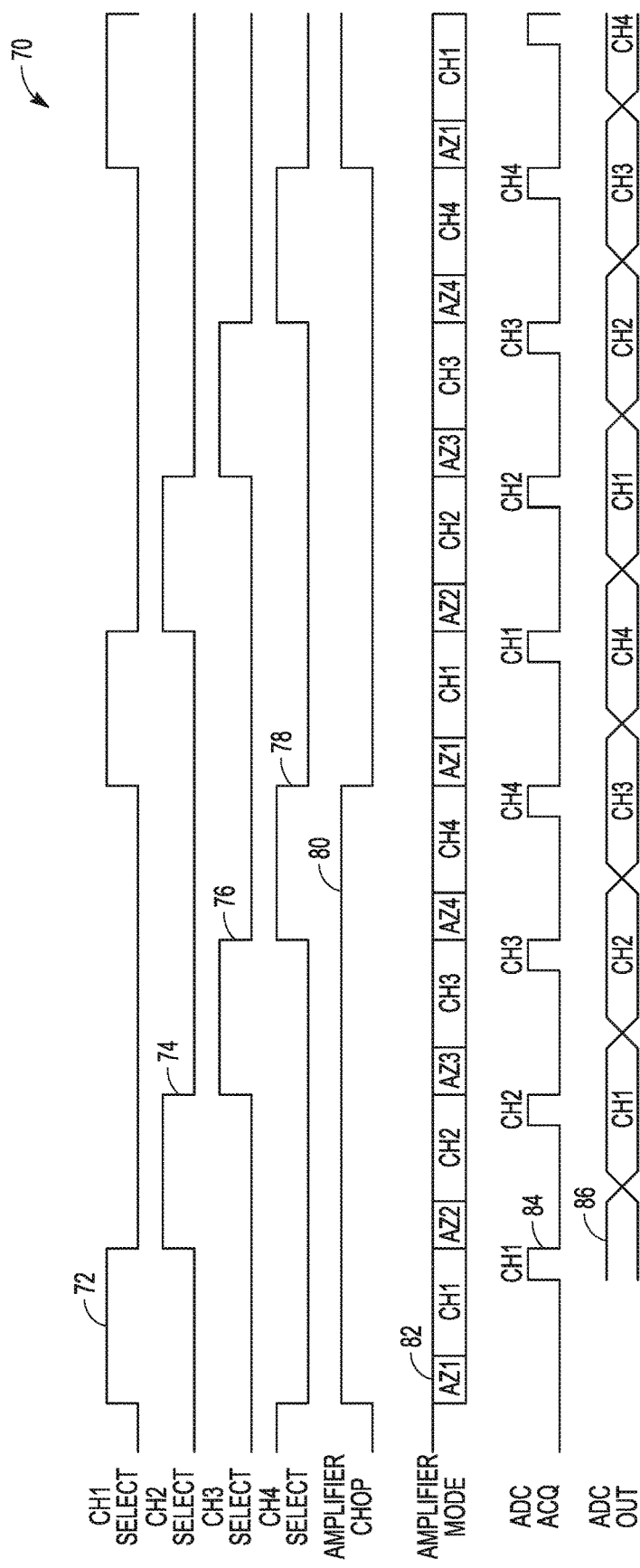
FIG. 2 is an example of a timing diagram that can be used with the circuits of FIG. 1 or FIG. 3.
Figure 3:
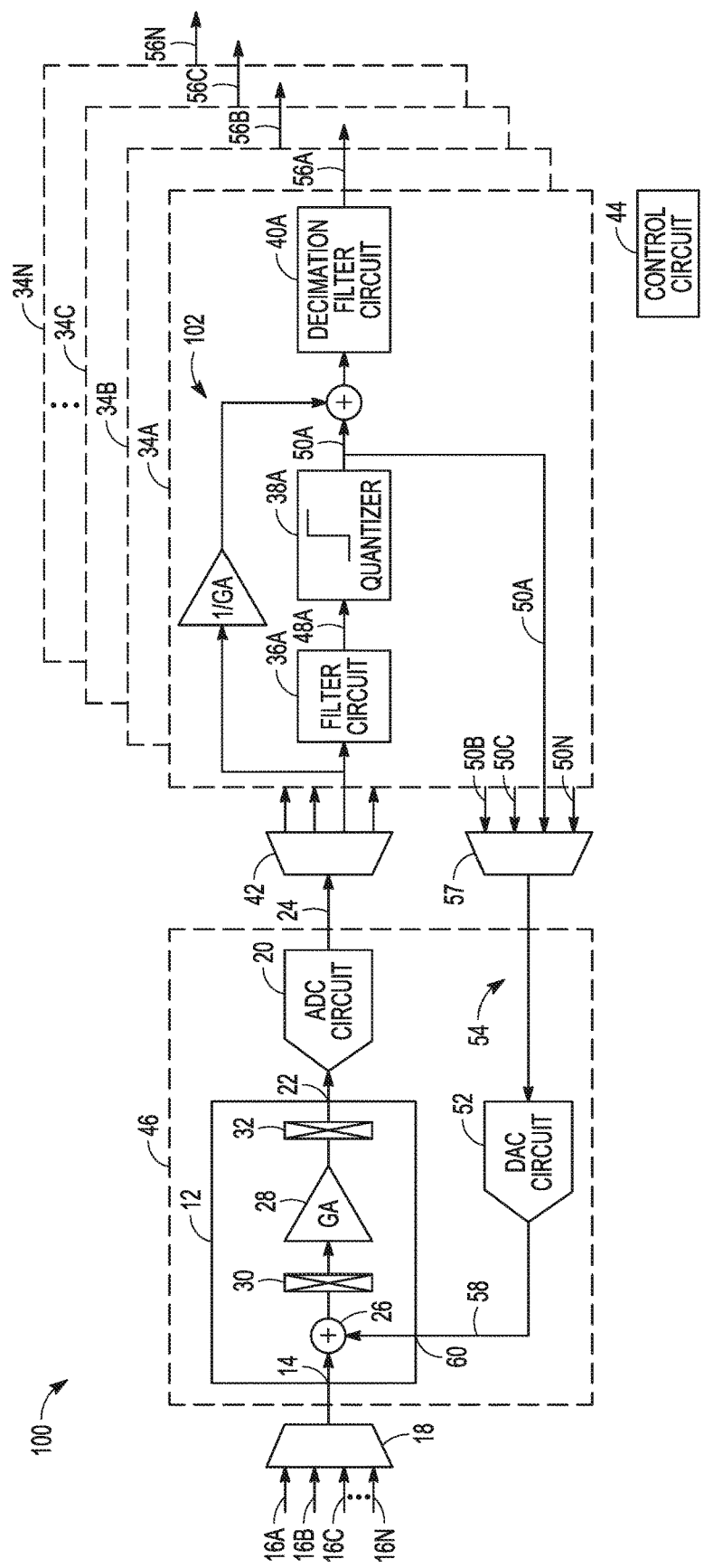
FIG. 3 is a block diagram of another example of a multiplexed, multiple channel sigma-delta analog-to-digital converter circuit in accordance with this disclosure.

FIG. 2 is an example of a timing diagram 70 that can be used with the circuits of FIG. 1 or FIG. 3. For purposes of simplicity, four (4) channel select signals 72-78 are shown in FIG. 2. In other implementations, there can be more than four channels or less than four channels. In addition to the channel select signals 72-78, the timing diagram 70 depicts a chop signal 80, an amplifier mode signal 82, and ADC acquisition signal 84, and an ADC output signal 86.

A control circuit, e.g., control circuit 44 of FIG. 1, can output channel select signals 72-78. For example, the control circuit can generate and apply a logic high signal for CH1 select signal 72 to the multiplexer circuit 18 of FIG. 1 (or FIG. 3) to select input signal 16A. The CH1 select signal 72 of the control circuit can also select a corresponding one of the digital channels, e.g., digital channel 34A of FIG. 1 (or FIG. 3), to process the digital output signal and can select a corresponding one of the DAC circuit 52 inputs, e.g., input 50A, for the feedback loop. Then, the control circuit can select the next set of signals corresponding to channel 2, channel 3, etc.

In some example configurations, the control circuit can control operation of the input multiplexer circuit and the demultiplexer circuit to select the plurality of digital channels in a sequential pattern, e.g., channel 1, followed by channel 2, then channel 3, and so forth. In other example configuration, the control circuit can control operation of the input multiplexer circuit and the demultiplexer circuit to select the plurality of digital channels in a non-sequential pattern. In one non-limiting illustrative configuration, the control circuit can control selection as follows channel 1, channel 1, channel 2, channel 2 . . . channel N, channel N. Other non-sequential patterns are also possible and are considered within the scope of this disclosure, such as channel 1, channel 3, channel 2, channel 4, and so forth.

In configurations that include chopping, the control circuit 44 can output a first chop signal, e.g., a logic high signal, to control the chop switches, e.g., chop switches 30, 32 in FIG. 1 (or FIG. 3), in a first chop cycle. The chopping can be done at 'N' times slower rate than the ADC acquisition signal 84 so that the chop cycle is shared for all 'N' channels. In a second chop cycle, the control circuit 44 can output a second chop signal, e.g., a logic low signal, to control the chop switches.

In addition, the gain amplifier circuit, e.g., amplifier circuit 28 of FIG. 1 (or FIG. 3), e.g., a capacitive gain amplifier, can be auto-zeroed. During each chop cycle, each channel can first be auto-zeroed (e.g., "AZ1", "AZ2", and so forth of the amplifier mode signal 82) to set the input common mode of the input capacitors of the amplifier circuit at the channel input and reset the DAC circuit. After the auto-zero phase, e.g., after AZ1, the DAC circuit can be set to the appropriate feedback signal as determined by the digital engine for that channel based on past cycles. The amplifier circuit can amplify the difference between the input signal of that channel and the DAC feedback signal (e.g., "CH1", "CH2", and so forth of the amplifier mode signal 82) to deliver an analog signal at the ADC input 22.

In some examples, an ADC circuit, e.g., ADC circuit 20 of FIG. 1 or (FIG. 3), can acquire the amplified difference signal from the amplifier circuit on the falling edge of the ADC acquisition signal 84. The ADC circuit can process the signal, e.g., perform bit trials, when the ADC acquisition signal 84 is a logic low. The digital output signal for the ADC circuit can be processed to deliver the digital output to a digital channel, as shown by the ADC OUT signal 86.

This digital signal can be processed by the digital filter circuit of a particular digital channel, e.g., digital channel 34A of FIG. 1 (or FIG. 3), and the appropriate output signal for that channel can be generated. As the filter circuit 36A is digital, the amplifier circuit and the ADC circuit can process the signal for the next channel as soon as the input is multiplexed to the next channel and the amplifier is auto-zeroed for that input.

It should be noted that the ADC OUT signal 24 does not need to occur with the auto-zeroing of the amplifier circuit. For example, auto-zero AZ2 of mode signal 82 can occur as soon as the ADC circuit acquires the channel 1 input signal. Then, the control circuit can control the input multiplexer circuit to connect to channel 2, the DAC circuit can be reset, and the analog circuit can begin to process the channel 2 data.

FIG. 3 is a block diagram of another example of a multiplexed, multiple channel sigma-delta ADC circuit 100 in accordance with this disclosure. Some of the elements shown in circuit 100 of FIG. 3 are similar to those shown and described above with respect to the circuit 10 of FIG. 1. For purposes of conciseness, the new features will be described in detail.

The circuit 100 of FIG. 3 can include a quantization error compensation circuit 102 to combine the output signal of the analog circuit 24 (which is also the digital input of the digital filter circuit 36A, for example) with the digital input signal of the DAC circuit, and output a quantization error-compensated signal to the digital decimation filter, e.g., signal 50A. In the example shown in FIG. 3, the two inputs can be combined using a ratio of 1/GE, where GE is the fixed gain of the gain amplifier circuit 28.

Realistic amplifier gain error (GA) can return the loop quantization noise but its contribution can be significantly suppressed using the techniques of FIG. 3. Amplifier gain error does not impact the signal transfer function (STF) in the band of interest as the loop gain can be high in the band of interest. The DAC circuit gain error can directly appear at the STF.

Additional information regarding the techniques of FIG. 3 can be found in U.S. patent application Ser. No. 15/621,621, titled "Quantization Noise Cancellation in a Feedback Loop" to Kalb et al. and filed on Jun. 13, 2017, the entire contents of which being incorporated herein by reference including for its description of quantization noise cancellation techniques.

Figure 4:
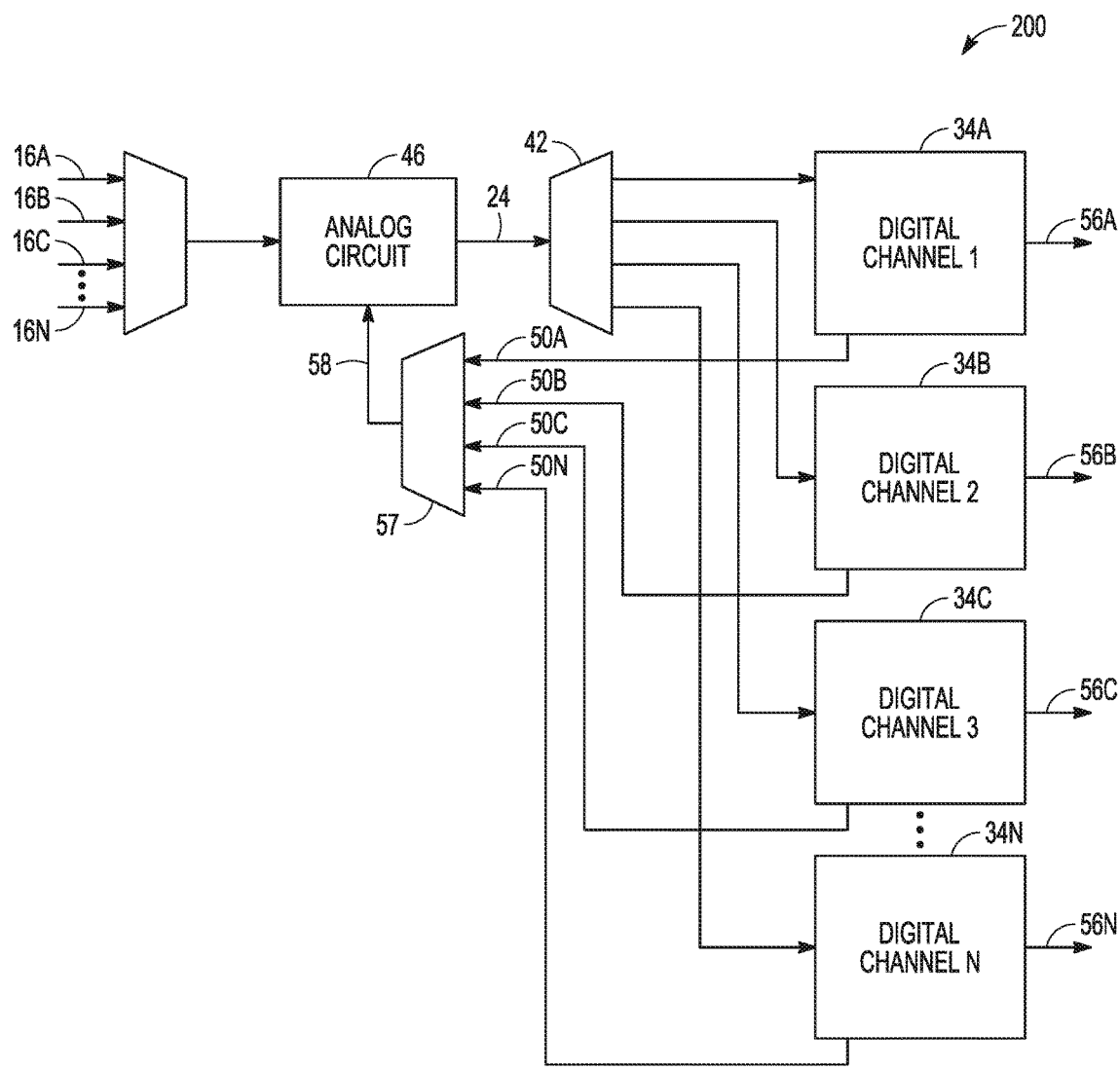
FIG. 4 is a simplified block diagram of a multiplexed, multiple channel sigma-delta analog-to-digital converter circuit in accordance with this disclosure.

FIG. 4 is a simplified block diagram of a multiplexed, multiple channel sigma-delta ADC circuit 200 in accordance with this disclosure. The circuit 200 of FIG. 4 can implement the techniques of FIGS. 1 and 3 and more clearly depicts the parallel connection of the digital channels 34A-34N and how each of the digital channels 34A-34N outputs a respective digital output signal 56A-56N corresponding to a particular one of the received analog input signals 16A-16N.

The architectures described in this disclosure can allow input signals of varied bandwidths, input ranges, and SNR requirements to be processed in multiplexed operation. A non-limiting illustrative configuration is described as follows. The sigma-delta ADC circuit architectures described in this disclosure can be configured to support eight multiplexed channels. The gain amplifier can be a CGA with a fixed gain of 16. The ADC circuit can be a 14-bit resolution SAR ADC sampling at 2 MHz. The DAC circuit can be a 7-bit DAC and, in some examples, noise-shaped.

In some example implementations, the sigma-delta ADC circuit can process up to 5V input signals and deliver 18-bit SNR at 625 samples per second (sps) with an oversampling rate (OSR) of 200). A few of the digital channels can operate without the digital feedback loop where the DAC circuit is disconnected or disabled. With CGA gain of 1, these channels can process up to 5V input signals and deliver output at 305 uV resolution at 250 ksps. With CGA gain of 16, some channels can process up to 300 mV input signals and deliver output at 18.3 uV resolution at 250 ksps. The converter architectures described in this disclosure can support these varied input signals and process them cycle-by-cycle with the same shared analog signal chain.

VARIOUS NOTES

Each of the non-limiting aspects or examples described herein may stand on its own, or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. A multiplexed multiple channel sigma-delta (SD) analog-to-digital converter (ADC) circuit comprising:
    a shared analog circuit configured to receive a selected one of a plurality of analog input signals, the shared analog circuit including:
        an ADC circuit coupled to an input of the analog circuit; and
        a digital-to-analog converter (DAC) circuit configured to provide an analog feedback signal to the input of the analog circuit; and
    a plurality of digital channels coupled to an output of the shared analog circuit and the DAC circuit, each of the plurality digital channels configured to generate a digital output signal representing a corresponding one of the analog input signals.

2. The SD ADC circuit of claim 1, further comprising:
    a gain amplifier circuit coupled to an input of the ADC circuit and configured to receive and amplify a difference between an output of the DAC circuit and one of the received analog input signals;
    a first chop switch circuit coupled to an input of the gain amplifier circuit; and
    a second chop switch circuit coupled to an output of the gain amplifier circuit.

3. The SD ADC circuit of claim 2, further comprising:
    a first multiplexer circuit coupled to the input of the analog circuit and configured to select the one of the plurality of analog input signals;
    a second multiplexer circuit coupled to an input of the DAC circuit and each the plurality of digital channels;
    a digital demultiplexer circuit coupled to an output of the analog circuit and each of the plurality of digital channels, the demultiplexer circuit configured to select one of the plurality of digital circuits to receive the output of the analog circuit; and
    a controller circuit configured to:
        control operation of the first and second multiplexer circuits and the demultiplexer circuit; and
        control operation of the first and second chop switches.

4. The SD ADC of claim 3, wherein the controller circuit is configured to control operation of the demultiplexer circuit to select the plurality of digital channels in a sequential pattern.

5. The SD ADC of claim 3, wherein the controller circuit is configured to control operation of the demultiplexer circuit to select the plurality of digital channels in a non-sequential pattern.

6. The SD ADC of claim 1, wherein the ADC circuit is a memoryless ADC circuit.

7. The SD ADC of claim 1, wherein each of the plurality of digital channels includes:
    a quantizer circuit coupled to an output of the digital filter circuit;
    a digital filter circuit configured to receive an output signal of the analog circuit and output a filter circuit output signal to the DAC circuit; and
    a digital decimation filter circuit configured to produce a digital output signal corresponding to a particular one of the received analog input signals.

8. The SD ADC circuit of claim 7, wherein each digital filter circuit includes a digital integrator circuit.

9. The SD ADC of claim 7, wherein each of the plurality of digital channels further includes:
    a quantization error compensation circuit coupled to an input of the digital decimation filter and the output of the quantizer circuit, the quantization error compensation circuit configured to combine the output signal of the analog circuit with an input signal of the DAC circuit and output a quantization error-compensated signal to the digital decimation filter.

10. A method of multiplexing multiple channels using a sigma-delta (SD) analog-to-digital converter (ADC) circuit, the method comprising:
    performing, using a shared analog circuit, an analog-to-digital conversion of a first input signal selected from a plurality of received analog input signals;
    processing a digital output of the shared analog circuit using a first digital channel selected from a plurality of digital channels;
    performing a digital-to-analog conversion on the processed digital output to generate a feedback signal to apply to an input of the shared analog circuit; and
    generating a digital output signal representing a corresponding one of the analog input signals.

11. The method of claim 10, further comprising:
    receiving and amplifying a difference between the feedback signal and one of the received analog input signals;
    controlling chop switch circuits coupled to an input and an output of the gain amplifier circuit; and
    controlling a first multiplexer circuit to select the first one of the plurality of the received analog input signals; and
    controlling a second multiplexer circuit to select one of the plurality of digital channels to couple to an input of a digital-to-analog converter (DAC) circuit.

12. The method of claim 10, further comprising:
    selecting other ones of the plurality of digital channels in a sequential pattern to receive a digital output of the shared analog circuit.

13. The method of claim 10, further comprising:
    selecting other ones of the plurality of digital channels in a non-sequential pattern to receive a digital output of the shared analog circuit.

14. The method of claim 10, wherein performing, using a shared analog circuit, an analog-to-digital conversion of a first input signal selected from a plurality of received analog input signals includes:
    performing an analog-to-digital conversion on the selected first input signal using a memoryless ADC circuit.

15. The method of claim 10, wherein performing, using a shared analog circuit, an analog-to-digital conversion of a first input signal selected from a plurality of received analog input signals includes:
    performing a successive approximation register (SAR) ADC operation on the selected first input signal.

16. The method of claim 10, wherein performing, using the shared analog circuit, the analog-to-digital conversion of the selected first input signal includes:
    performing a flash ADC operation on the selected first input signal.

17. The method of claim 10, wherein performing, using the shared analog circuit, the analog-to-digital conversion of the selected first input signal includes:
   performing a pipelined ADC operation on the selected first input signal.

18. The method of claim 10, further comprising:
   combining the digital output signal of the analog circuit with an input signal of a digital-to-analog converter (DAC) circuit and outputting a quantization error-compensated signal to a digital decimation filter.

19. A multiplexed multiple channel sigma-delta (SD) analog-to-digital converter (ADC) circuit comprising:
   means for performing, using a shared analog circuit, an analog-to-digital conversion of a first input signal selected from a plurality of received analog input signals;
   means for processing the digital output of the shared analog circuit using a first digital channel selected from a plurality of digital channels;
   means for performing a digital-to-analog conversion on the processed digital output to generate a feedback signal to apply to an input of the shared analog circuit; and
   means for generating a digital output signal representing a corresponding one of the analog input signals.

20. The SD ADC circuit of claim 18, further comprising:
   means for receiving and amplifying a difference between the feedback signal and one of the received analog input signals;
   means for chopping an input and an output of the gain amplifier circuit; and
   means for selecting the first one of the plurality of the received analog input signals; and
   means for selecting one of the plurality of digital channels to couple to an input of a digital-to-analog converter (DAC) circuit.

* * * * *

UNITED STATES PATENT AND TRADEMARK OFFICE
CERTIFICATE OF CORRECTION

PATENT NO. : 10,355,709 B1
APPLICATION NO. : 16/111440
DATED : July 16, 2019
INVENTOR(S) : Sharma et al.

Page 1 of 1

It is certified that error appears in the above-identified patent and that said Letters Patent is hereby corrected as shown below:

In the Claims

Column 9, Line 41, Claim 3, after "each", insert --of--

Column 10, Line 36, Claim 11, after "circuit;", delete "and"

Signed and Sealed this
Twenty-first Day of April, 2020

Andrei Iancu
*Director of the United States Patent and Trademark Office*